United States Patent [19]

Carlile

[11] Patent Number: 5,077,543
[45] Date of Patent: Dec. 31, 1991

[54] BALANCED LOW-PASS COMMON MODE FILTER

[75] Inventor: Bruce W. Carlile, Chelmsford, Mass.

[73] Assignee: Ungermann-Bass, Inc., Santa Clara, Calif.

[21] Appl. No.: 651,884

[22] Filed: Feb. 7, 1991

[51] Int. Cl.[5] .............................................. H03H 7/00
[52] U.S. Cl. ..................................... 333/177; 333/25; 333/181; 333/167; 363/47
[58] Field of Search ................. 333/177, 25, 181, 167, 333/12, 178, 179, 180; 336/170; 363/47

[56] References Cited

U.S. PATENT DOCUMENTS 4,766,402  8/1988  Crane ................................... 333/25

*Primary Examiner*—Eugene R. Laroche
*Assistant Examiner*—Ali Neyzari
*Attorney, Agent, or Firm*—Townsend and Townsend

[57] ABSTRACT

A balanced T-section low-pass common mode filter is connected in series with balanced data I/O lines to remove common mode signals from balanced line difference mode signals. The filter includes input and output series transformers configured so that the magnetic fields in the transformers are subtractive for out-of-phase difference mode signals and additive for in-phase common mode signals and a shunt transformer coupled to ground configured so that the magnetic fields in the transformer are additive for out-of-phase difference mode signals and subtractive for in-phase common mode signals. Accordingly, the difference mode signals are not attenuated and common mode signals react to a short circuit to ground and are thereby attenuated by the filter.

4 Claims, 3 Drawing Sheets

BALANCED LOW-PASS COMMON MODE FILTER

BACKGROUND OF THE INVENTION

Electromagnetic interference (EMI) is a class of interference caused by electric and magnetic fields that are generated by many sources such as digital circuits, switching power supplies, electromechanical devices, or even lightning. This interference can be very broadband in nature covering a frequency spectrum from a few kilohertz to many thousands of megahertz.

Radiated EMI is propagated through the air by electromagnetic fields, while conducted EMI is carried via currents on such items as wiring, etc. Radio frequency interference is a subset of EMI generally in the "radio" bands, i.e., above a few megahertz.

EMI comprises the bulk of what is loosely referred to as "electrical noise." Computers and other digital equipment are a source of EMI noise frequencies from around 100 kHz to 10 GHz, and one of the major contributors to radiation is the common mode signal. Designers go to great lengths to rid signals of unwanted noise and to prevent noise from being generated. Only clean, reliable signals must enter and emanate from digital circuits, or else users and nearby users will be plagued with reliability and operability problems.

The Federal Communications Commission (FCC) and other agencies promulgate maximum emission regulations in order to prevent interference with radios, televisions, and other communication devices that depend on broadcast signals. It is an axiom that a circuit that radiates noise is also susceptible to EMI interference as well; thus, noise is sometimes said to be a two-way street. Filters which are designed to reduce EMI susceptibility tend also to reduce EMI emissions, and vice versa.

For relatively low frequency signals, such as frequencies below one megacycle, data lines are often single ended and are relatively easy to filter. At higher data transfer frequencies, filtering is more difficult. For balanced data I/O signals which utilize difference mode signals to carry the information, common mode noise represents a serious problem. At present, several manufacturers offer "three-lead" low pass EMI filters to filter unwanted EMI from data I/O lines. On balanced lines, two such filters would be used.

These three-lead filters typically comprise two ferrite beads inserted in series with an I/O line, with a capacitor to ground from the midpoint of the two series-connected ferrite beads. To date, however, these three-lead filters have been unable to accomplish the required task: remove unwanted common mode noise while leaving the difference mode signal undisturbed. The three-lead low-pass approach has been shown to be unsatisfactory for balanced I/O lines because the filters themselves introduce an unwanted frequency characteristic into the difference mode signals.

The problem with introducing a frequency characteristic into the difference mode signal is that the data can be affected. For example, if a 10 MHz data signal is present, and a conventional low pass filter is used to attenuate common mode noise above 30 MHz, the low pass filter can disturb the timing of the 10 MHz data signal and cause distortion.

Thus, there has been a great need for an economical common mode filter which removes unwanted common mode signals from balanced high-speed data I/O lines and which leaves difference mode signals undisturbed.

SUMMARY OF THE INVENTION

A balanced ferrite low-pass common mode filter is provided to remove common mode noise from balanced difference mode signals carried by balanced data I/O lines. According to one aspect of the invention, a T-section configuration utilizes three broadband ferrite transformers employing bifilar windings.

Common mode signals are, by definition, "in-phase" signals travelling along both wires of a data I/O pair. The difference mode signals are, by definition, an "out-of-phase" signal on each wire of the pair. Thus, for common mode signals, at any instant an equivalent current flows in the same direction through both wires. Hence, "common" mode. For difference mode signals, at any given instant, current flows in opposite directions through the pair of data I/O wires.

EMI effects are generated by current flowing in the same direction in both wires at a given instant and thus are a common mode signal.

The present invention exploits this "in-phase" and "out-of-phase" distinction by providing a transformer configuration wherein the transformer sense (dot polarities) and winding connections are configured so that common mode signals react to a different circuit topology than does the difference mode signal. The common mode signal reacts to a high input impedance followed by a low impedance to ground, followed by a high impedance on the output side of the filter. The high impedance on the output side of the filter forms a voltage divider with the common mode impedance on the wiring thus further reducing the amplitude of the common mode signal on the wiring. In contrast, the difference mode signal is virtually unimpeded, reacting to virtually no input or output impedance contributed by the common mode filter itself, and reacting to only a high impedance path between the two conductors. The difference mode signal will react to the circuit impedance presented by the wiring to which it is attached.

According to another aspect of the invention, an L-section configuration includes transformers having sense (dot polarities) and winding connections configured to attenuate common mode noise but not difference mode signals.

According to a further aspect of the invention, the transformers are formed by wire windings on a single common ferrite core.

According to a still further aspect of the invention, optional capacitors are utilized to provide direct current isolation.

It is an object of the present invention to fill a need in the art for an economical common mode filter which neither attenuates the difference mode signal nor introduces unwanted frequency characteristics into the difference mode signal, yet removes the unwanted common mode signal from balanced data I/O lines, thereby reducing EMI emission and susceptibility.

DESCRIPTION OF THE DRAWINGS

The above objects, advantages, and features of the present invention will become more readily apparent from the following detailed description of the invention when considered in conjunction with the drawings wherein.

DETAILED DESCRIPTION OF THE PRESENT INVENTION

Figure 1:
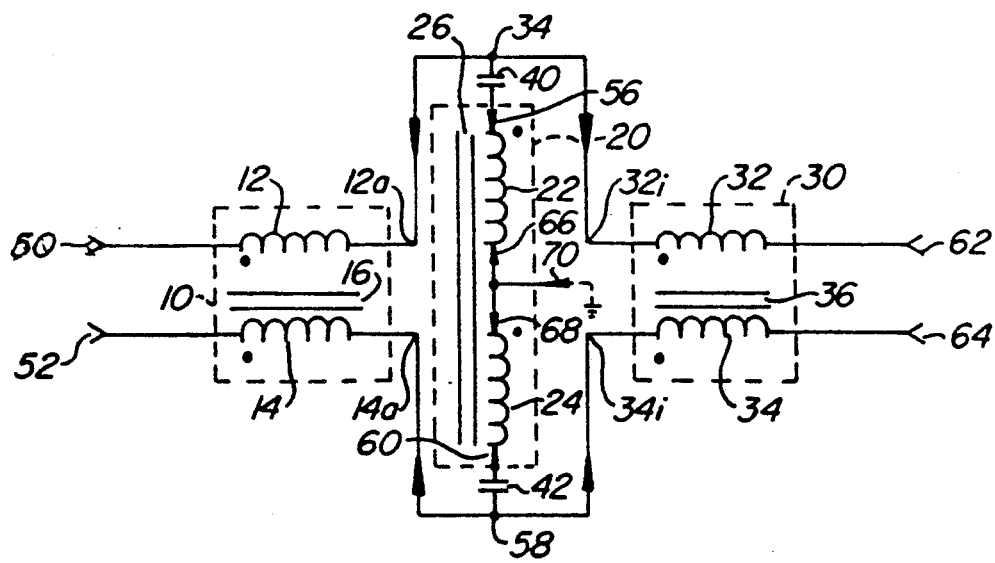
FIG. 1 is a schematic diagram showing a T-section embodiment of the present invention.

Referring to FIG. 1, a preferred embodiment of the invention is the balanced T-section low-pass common mode filter. The T-section filter of FIG. 1 comprises a first series transformer 10 employing first and second windings 12 and 14 wound on a first ferrite core 16, a shunt transformer 20 employing third and fourth windings 22 and 24 wound on a second ferrite core 26, a second series transformer 30 employing fifth and sixth windings 32 and 34 wound on third ferrite core 36, and optional D.C. blocking capacitors 40 and 42.

Figure 2:
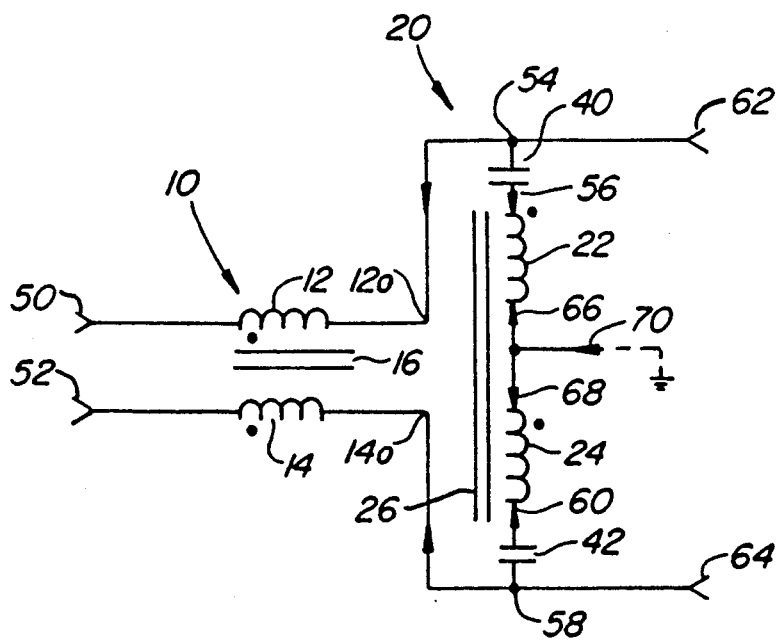
FIG. 2 is a schematic diagram showing an L-section embodiment of the present invention.

Another preferred embodiment of the present invention is the L-section filter of FIG. 2 which comprises a series transformer 10, shunt transformer 20, and optional blocking capacitors 40 and 42.

The T-section filter is preferred due to higher attenuation of the common mode signal. This increased attenuation, however, is obtained at the price of increased complexity, size and cost. The T-section filter will also provide attenuation of common mode signals that are present on the output wiring and which would tend to propagate into the source circuitry (susceptibility considerations).

Referring again to FIG. 1, the inputs of the first and second windings 12 and 14 are connected to a pair of external input data I/O lines 50 and 52. A first terminal 54 of the first capacitor 40 is connected to the outputs of the first and fifth windings 12 and 32 and a second terminal 56 of the first capacitor 40 is connected to the input of the third winding 22. Similarly, a first terminal 58 of the second capacitor 42 is connected to the outputs of the second and sixth windings 14 and 34 and a second terminal 60 of the second capacitor 42 is connected to the input of the fourth winding 24.

Third and fourth windings 22 and 24 are connected in series between the second terminal 56 of capacitor 40 and the second terminal 60 of capacitor 42. The midpoint of the series connection of windings 22 and 24 is connected to ground.

The input 32i of a fifth winding 32 is connected to the electrical junction of the output 12o of winding 12 and the first terminal 54 of the first capacitor 40. Similarly, the input 34i of a sixth winding 34 is connected to the electrical junction of the output 14o of the second winding 14 and the first terminal 58 of the second capacitor 42. The outputs of the windings 32 and 34 are connected to external output data I/O lines 62 and 64.

Figure 4:
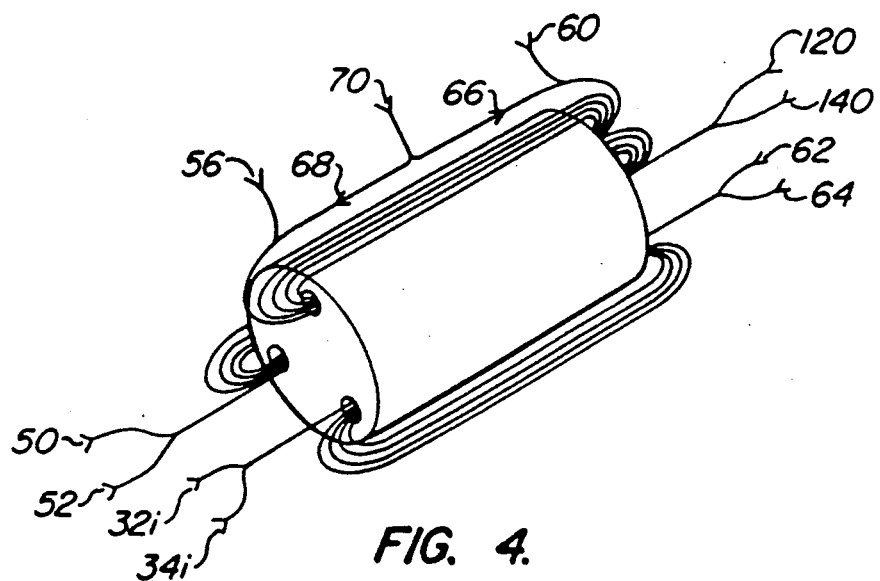
FIG. 4 is a perspective view of three transformers wound on a common core utilized by a T-section embodiment of the present invention.

The transformers 10, 20, and 30 of the T-section filter depicted in FIG. 1 are wound on separate broadband ferrite cores 16, 26, and 36. However, for economy and ease of assembly, the transformers may alternatively be mounted on a common broadband ferrite core as depicted in FIG. 4.

Referring again to FIG. 1, the first series transformer 10 further comprises a broadband ferrite core 16, a first winding 12, and a second winding 14. The windings 12 and 14 are wound with a plurality of turns in a bifilar fashion on the broadband ferrite core 16 to maximize coupling between the windings 12 and 14.

The shunt transformer 20 further comprises a broadband ferrite core 26, a third winding 22, and a fourth winding 24. The windings 22 and 24 are wound with a plurality of turns in a bifilar fashion on the broadband ferrite core 26 to maximize coupling between the windings 22 and 24.

The second series transformer 30 further comprises a broadband ferrite core 36, a fifth winding 32, and a sixth winding 34. The windings 32 and 34 are wound with a plurality of turns in a bifilar fashion on the broadband ferrite core 36 to maximize coupling between the windings 32 and 34.

For the above-described transformers, although the number of turns on the transformer is not critical, a higher impedance is preferred. Therefore, the transformers should be wound with as many turns as the chosen core window of the broadband ferrite core will allow.

It should be noted, however, that too many turns on too large ferrite core can reduce the high frequency performance of the device due to excess stray reactances. This is not an area of critical sensitivity, however, and would be obvious during a measured performance evaluation of the device.

The broadband ferrites 16, 26, and 36 used in the transformers 10, 20, and 30 depicted in FIG. 1 of the present invention are individual broadband ferrite cores and are readily available from a variety of manufacturers. "Broadband" refers to the ferrite's ability to handle frequencies over a range of about 10 to 500 megacycles. Many types of ferrite mixes are available commercially. Many are high Q, but the present invention obtains optimal performance with low Q, broadband ferrites, such as Fair-Rite Type 43 material.

Although low Q broadband ferrites are preferred, the common mode filter performance of the present invention is largely independent of the transformer core devices used, and cores that would not normally be used as a common mode choke due to insufficient impedance will nonetheless perform adequately when used in the common mode filter configuration. A common mode choke is a single high impedance being presented to the common mode signal such as would happen if only first transformer 10 with first winding 12 and second winding 14 were present. The insensitivity to device parameters of the common mode filter of the present invention is due to the fact that a transformer with a lower series impedance will also have a lower common mode impedance to ground from the two data lines, and so the overall voltage divider action will remain the same as obtained using a transformer with a larger series impedance.

The three transformers 10, 20, and 30 need to be independent, i.e., mutual inductance effects are to be avoided. By using individual ferrite cores this result is obtained. But for ease of assembly, as well as for reasons of economy, a common core may be used for all transformers provided that precautions are taken to minimize inductive coupling between transformers.

FIG. 4 shows an embodiment of the winding structure used in the T-section filter which shows three sets of bifilar windings wound on a three-hole ferrite core. By utilizing a separate hole and the nearest outside edge of the core for the bifilar windings, only negligible coupling is obtained between transformers.

Figure 3:
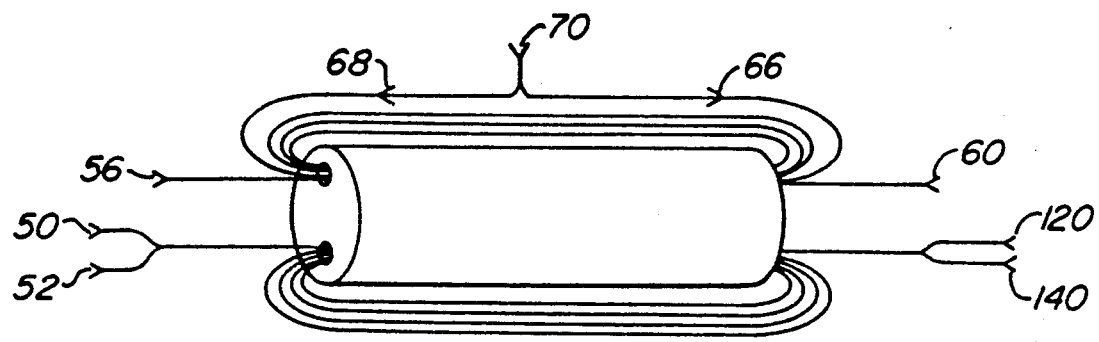
FIG. 3 is a perspective view of two transformers wound on a common core utilized by an L-section embodiment of the present invention.
Figure 5:
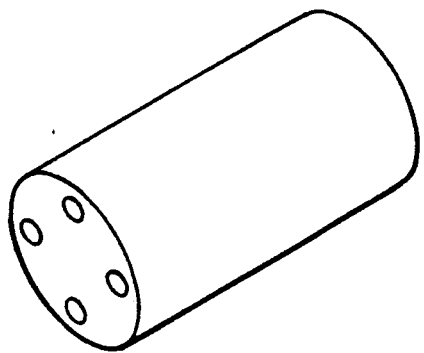
FIG. 5 is a four-hole core suitable for winding transformers.

Many other winding configurations are possible for both the L-section and T-section embodiments, including using individual toroids, two hole ferrite cores (FIG. 3), four hole ferrites (FIG. 5), or DIP packages which contain miniature common mode chokes with each individual winding brought out to a terminal.

In FIG. 1 and 2, the capacitor 40 is used for electrical direct current isolation between the input of the third winding 22 and the electrical junction formed by the electrical connection of the output 12o of the first winding 12 and the input 32i of the fifth winding 32. Similarly, the capacitor 42 is used for electrical direct current isolation between the output of the fourth winding 24 and the electrical junction formed by the electrical connection of the output 14o of the second winding 14 and the input 34i of the sixth winding 34.

The capacitance values of the capacitors 40 and 42 are not critical. Also, the capacitors are not required if direct current blockage is not required. Capacitor values of between 100 picofarads and 2000 picofarads will typically suffice, depending on the application. However, if used, it is important that the capacitors 40 and 42 have equivalent nominal values, and preferably are of a tight tolerance type. The capacitors 40 and 42 may be mounted physically on the windings or external to the windings on a printed circuit board.

For each set of windings, first 12 and second 14, third 22 and fourth 24, and fifth 32 and sixth 34, a good bifilar structure is imperative. If two wires are taken and only loosely wound together, the performance of the present invention will be degraded. Bifilar wire is constructed using two individual wires tightly coupled together, usually with glue or tight physical twisting. The present invention requires that the coupling coefficient between the two windings of a set be as close to one as possible. Therefore the wires must either be tightly twisted or glued together because close coupling between windings is essential. In sum, maximum coupling between the two windings constituting a transformer is essential, while minimal inductive coupling between the individual transformers is also essential.

The transformer sense of the windings, as depicted by the dot polarity markings on each of the six windings 12, 14, 22, 24, 32, and 34 in FIG. 1, is central to an understanding of the invention. The dot markings indicate winding inputs of corresponding transformer sense polarity. For example, if one physically inspects the rotational nature of third and fourth windings 22 and 24, beginning from their dot-marked inputs, one will find that both windings encircle the ferrite core in the same direction.

The significance of the transformer dot markings is as follows with reference to FIG. 1. If, at any given moment, alternating current on one line enters the dotted end of first winding 12 and alternating current on the other line enters the dotted end of second winding 14, the flux generated at that instant in the first ferrite core 16 will be additive and the alternating current on each line will be presented with a substantial impedance.

If, on the other hand, alternating current at a given instant enters the dotted end of first winding 12 but also enters the undotted end (exits the dotted end) of second winding 14, the flux generated at that instant in the first ferrite core will be subtractive and the alternating current on each of the two lines will be presented with negligible impedance.

The present invention is effective in attenuating common mode signals but not difference mode signals because these two signals react to a differently configured circuit due to magnetic field cancellation or addition. Each of the three sets of windings, first and second windings 12 and 14, third and fourth windings 22 and 24, and fifth and sixth windings 32 and 34, presents an impedance in the path of a difference mode signal which is different than presented to a common mode signal. Each set of windings will be examined in turn.

Referring to the input windings comprising first winding 12 and second winding 14 of the first transformer 10 in FIG. 1, it must be recalled that the difference mode (data) signals are by definition out of phase. In other words, at a given instant current might be entering the filter on first data line 50 while simultaneously current may be exiting the filter on data line 52. At such a given moment, then, data signal current will be entering the dotted end of first winding 12 and exiting the undotted end of winding 14.

As the magnetic field in the first ferrite core 16 is increased by the data signal current through first winding 12, the magnetic field is decreased by an equivalent amount by the data signal current in second winding 14. Therefore, for the difference mode signals, the magnetic field in the transformer cancels, and the difference mode signal does not react to any impedance associated with first and second windings 12 and 14.

The common mode signal, by definition, has an equivalent current flowing in the same direction through both data I/O lines. Therefore, if, at a given moment, common mode current from data line 50 enters the dotted end of first winding 12, then an equivalent common mode current enters the dotted end of second winding 14. So as the magnetic field is increased by the current through first winding 12, the magnetic field is further increased by an equivalent amount of current in second winding 14. Therefore, for the common mode signal, the magnetic fields in the transformer are added.

Thus, the common mode signal component reacts to a large input impedance because the dot polarities of first and second windings 12 and 14 are such that the magnetic fields are additive for common mode signals. On the other hand, the difference mode signal component reacts to no input impedance because the dot polarities of first and second windings 12 and 14 are such that the magnetic fields are subtractive for difference mode signals.

Referring to the shunt transformer 20 comprising third and fourth windings 22 and 24 and second ferrite core 26, the difference mode (data) signals are out of phase, meaning that as current enters the dotted end of third winding 22, current will be exiting the undotted end of fourth winding 24 so as the magnetic field is increased by the current through the third winding 22, the magnetic field is increased by an equivalent amount by the current in the fourth winding 24. Therefore, for the difference mode signal, the magnetic field in the transformer adds, and the difference mode signal racts to a large (and unattractive) impedance from line to line via the path of windings 22 and 24.

On the other hand, at any given instant the common mode signal has an equivalent current flowing in the same direction through both data I/O lines. Therefore, since the midpoint of windings 22 and 24 is connected to ground, the common mode current enters the dotted end of winding 22 but enters the undotted end of winding 24. So as the magnetic field is increased by the current through winding 22, the magnetic field is decreased by an equivalent amount of current in winding 24. Therefore, for the common mode signal, the magnetic fields in the transformer are canceled and common mode signals react to a low impedance circuit path to ground, resulting in severe attenuation.

Thus, the common mode signal component reacts to a low impedance to ground (common mode short) because the dot polarities of windings 22 and 24 are such that the magnetic fields are subtractive for common mode signals, while the difference mode signal component reacts to a high impedance from line to line because the dot polarities of the third and fourth windings 22 and 24 are such that the magnetic fields are additive for difference mode signals.

The analysis for the output impedance windings 32 and 34 is identical to that for the input impedance windings. Thus, the common mode signal component reacts to a large input impedance because the dot polarities of windings 32 and 34 are such that the magnetic fields are additive for the common mode signal component, while the difference mode signal component reacts to negligible input impedance because the dot polarities of windings 32 and 34 are such that the magnetic fields are subtractive for difference mode signals.

FIG. 2 illustrates the L-section common mode filter embodiment. The L-section embodiment is identical in features and functions to the T-section embodiment except that the L-section filter omits the third transformer 30. As with the T-section filter, the transformers may be mounted on separate ferrite cores or on a common core to facilitate assembly (provided that the winding technique avoids coupling between transformers).

Figure 6:
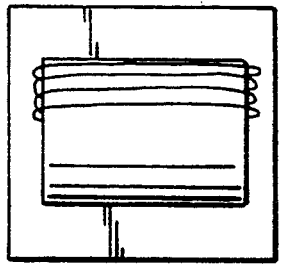
FIG. 6 is a top view of transformers mounted on an eight-pin DIP header.
Figure 7:
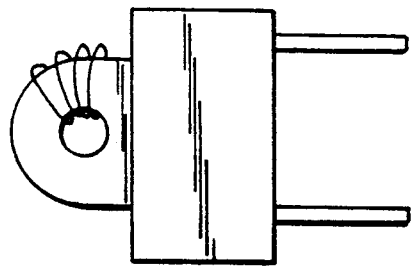
FIG. 7 is a side view of the mounted transformers of FIG. 6.
Figure 8:
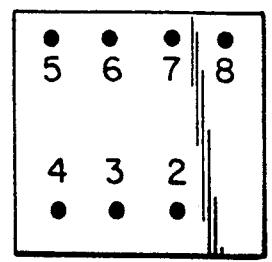
FIG. 8 is a bottom view of an eight-pin DIP header.
Figure 9:
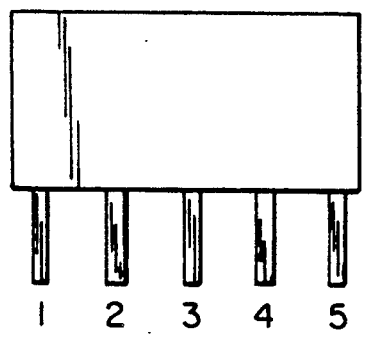
FIG. 9 is a side view of a five-pin SIP header.
Figure 10:
FIG. 10 is an end view of the header of FIG. 9.

FIG. 6 shows an embodiment of the L-section filter which is mounted on a small DIP header. This configuration utilizes a single dual hole ferrite core for the transformers, only one winding of which is visible in FIG. 6. FIG. 7 shows a side view of the same embodiment and FIG. 8 shows a bottom view of the header used to mount the transformers. FIGS. 9 and 10 show an embodiment of the L-section filter which is mounted on a SIP header.

The invention has now been described with reference to several preferred embodiments. Alternatives and substitutions will now be apparent to persons of skill in the art. In particular, the common ferrite core utilized to implement the cores of the series and shunt transformers may be alternatively configured as is known in the art. Accordingly, it is not intended to limit the invention except as provided by the appended claims.

What is claimed is:

1. A balanced T-section low-pass common mode filter, said common mode filter being externally connected in series with a pair of balanced data I/O lines to remove common mode signals from balanced line difference mode signals, common mode signals being by definition in-phase and difference mode signals being by definition out-of-phase, said filter employing series transformers configured such that the magnetic fields in the series transformers are subtractive for out-of-phase difference mode signals and additive for in-phase common mode signals, said filter also employing shunt transformers configured such that the magnetic fields in the shunt transformer are additive for out-of-phase difference mode signals and subtractive for in-phase common mode signals, said common mode filter comprising:

a first, second, and third ferrite core, each having a winding aperture;

a first series transformer formed by first and second windings wound bifilar with a plurality of turns through said aperture of said first ferrite core and around outside surface of said first ferrite core, said first and second windings each having an input and an output, said inputs of said first and second windings being connected to the pair of external input data I/O lines, said first and second windings wound in the same direction through said aperture of said first ferrite core so that difference mode signals react to a low impedance because the magnetic fields in said first transformer are subtractive for out-of-phase difference mode signals while common mode signals react to a high impedance because the magnetic fields in said first transformer are additive for in-phase common mode signals;

a shunt transformer formed by third and fourth windings wound bifilar with a plurality of turns through said aperture of said second ferrite core and around outside surface of said second ferrite core, said third and fourth windings each having an input and an output, said input of said third winding connected to said output of said first winding, said output of said fourth winding connected to said output of said second winding, said third and fourth windings wound in the same direction through said second aperture, said output of said third winding connected externally to ground, said output of said third winding also being connected in series with said input of said fourth winding so that common mode signals react to a short circuit impedance to ground because the magnetic fields in said second transformer are subtractive for in-phase signals, while difference mode signals react to a high impedance from line to line because the magnetic fields in said second transformer are additive for out-of-phase signals; and a second series transformer formed by fifth and sixth windings wound bifilar with a plurality of turns through said aperture of said third ferrite core and around outside surface of said third ferrite core, said fifth and sixth windings each having an input and output, said input of said fifth winding connected to both said output of said first winding and said input of said third winding, said input of said sixth winding connected to both said output of said second winding and said output of said fourth winding, said outputs of said fifth and sixth windings being connected to the pair of external data I/O lines, said fifth and sixth windings wound in the same direction through said third aperture so that difference mode signals react to a low impedance because the magnetic fields in said third transformer are subtractive for out-of-phase difference mode signals while common mode signals react to a high impedance because the magnetic fields in said third transformer are additive for in-phase common mode signals.

2. The T-section common mode filter according to claim 1, wherein for ease of assembly, said first, second, and third ferrite cores are formed in a common ferrite core having three winding apertures, with each transformer utilizing a separate winding aperture in said common ferrite core in order to minimize magnetic coupling between the windings of said first, second, and third transformers.

3. A balanced T-section low-pass common mode filter, said common mode filter being externally connected in series with a pair of balanced data I/O lines to remove common mode signals from balanced line difference mode signals, common mode signals being by definition in-phase and difference mode signals being by definition out-of-phase, said filter employing series transformers configured such that the magnetic fields in the series transformers are subtractive for out-of-phase difference mode signals and additive for in-phase common mode signals, said filter also employing shunt transformers configured such that the magnetic fields in the shunt transformer are additive for out-of-phase difference mode signals and subtractive for in-phase common mode signals, said common mode filter comprising:

a first, second, and third ferrite core, each having a winding aperture;

a first series transformer formed by first and second windings wound bifilar with a plurality of turns through said aperture of said first ferrite core and around outside surface of said first ferrite core, said first and second windings each having an input and an output, said inputs of said first and second windings being connected to the pair of external input data I/O lines, said first and second windings wound in the same direction through said aperture of said first ferrite core so that difference mode signals react to a low impedance because the magnetic fields in said first transformer are subtractive for out-of-phase difference mode signals while common mode signals react to a high impedance because the magnetic fields in said first transformer are additive for in-phase common mode signals;

first and second D.C. blocking capacitors, each having an input and an output, said input of said first capacitor connected to said output of said first winding, said input of said second capacitor connected to said output of said second winding;

a shunt transformer formed by third and fourth windings wound bifilar with a plurality of turns through said aperture of said second ferrite core and around outside surface of said second ferrite core, said third and fourth windings each having an input and an output, said input of said third winding connected to said output of said first capacitor, said output of said fourth winding connected to said output of said second capacitor, said third and fourth windings wound in the same direction through said second aperture, said output of said third winding connected externally to ground, said output of said third winding also being connected in series with said input of said fourth winding so that common mode signals react to a short circuit impedance to ground because the magnetic fields in said second transformer are subtractive for in-phase signals, while difference mode signals react to a high impedance from line to line because the magnetic fields in said second transformer are additive for out-of-phase signals; and a second series transformer formed by fifth and sixth windings wound bifilar with a plurality of turns through said aperture of said third ferrite core and around outside surface of said third ferrite core, said fifth and sixth windings each having an input and output, said input of said fifth winding connected to both said output of said first winding and said input of said first capacitor, said input of said sixth winding connected to both said output of said second winding and said input of said second capacitor, said outputs of said fifth and sixth windings being connected to the pair of external data I/O lines, said fifth and sixth windings wound in the same direction through said third aperture so that difference mode signals react to a low impedance because the magnetic fields in said third transformer are subtractive for out-of-phase difference mode signals while common mode signals react to a high impedance because the magnetic fields in said third transformer are additive for in-phase common mode signals.

4. The T-section common mode filter according to claim 3, wherein for ease of assembly, said first, second, and third ferrite cores are formed in a common ferrite core having three winding apertures, with each transformer utilizing a separate winding aperture in said common ferrite core in order to minimize magnetic coupling between the windings of said first, second, and third transformers.

* * * * *